(12) United States Patent
Joo et al.

(10) Patent No.: US 10,567,018 B2
(45) Date of Patent: Feb. 18, 2020

(54) CURRENT-TO-VOLTAGE CONVERTER PROVIDING VARIABLE BANDWIDTH AND APPARATUS INCLUDING THE SAME

(71) Applicant: SAMSUNG ELECTRONICS CO., LTD., Suwon-si (KR)

(72) Inventors: Seong-won Joo, Seoul (KR); Ji-soo Chang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/196,149

(22) Filed: Nov. 20, 2018

(65) Prior Publication Data
US 2019/0305809 A1 Oct. 3, 2019

(30) Foreign Application Priority Data
Mar. 29, 2018 (KR) .................. 10-2018-0036607

(51) Int. Cl.
| H03D 1/04 | (2006.01) |
| H04B 1/10 | (2006.01) |
| H03F 3/45 | (2006.01) |
| H03F 1/26 | (2006.01) |

(52) U.S. Cl.
CPC ............ *H04B 1/1036* (2013.01); *H03F 1/26* (2013.01); *H03F 3/45475* (2013.01); *H03F 3/45941* (2013.01); *H03F 2200/294* (2013.01)

(58) Field of Classification Search
CPC ............... H04B 1/1036; H03F 3/45941; H03F 3/45475; H03F 1/26; H03F 2200/294
See application file for complete search history.

(56) References Cited

U.S. PATENT DOCUMENTS

| 6,404,281 | B1 | 6/2002 | Kobayashi |
| 7,590,393 | B2 | 9/2009 | Sobel et al. |
| 8,830,000 | B2 | 9/2014 | Jeong et al. |
| 9,124,246 | B2 | 9/2015 | Chang et al. |
| 9,219,507 | B2 | 12/2015 | Rofougaran et al. |
| 9,344,124 | B2 | 5/2016 | Lau et al. |
| 2015/0084688 | A1* | 3/2015 | Chang ............... H03H 11/0466 327/555 |
| 2018/0048293 | A1* | 2/2018 | Gathman ............. H03H 11/126 |

FOREIGN PATENT DOCUMENTS

KR 10-2015-0042512 A 4/2015

\* cited by examiner

*Primary Examiner* — Dhaval V Patel
(74) *Attorney, Agent, or Firm* — Sughrue Mion, PLLC

(57) ABSTRACT

Provided is a current-to-voltage converter for converting a current signal into a voltage signal. The current-to-voltage converter may include: a trans-impedance amplifier including an input terminal and an output terminal; a resistor-capacitor (RC) circuit including a first end and a second end respectively connected to the input terminal and the output terminal of the trans-impedance amplifier, and a resistor and a capacitor connected to each other in parallel between the first end and the second end; and a plurality of switches configured to form at least one of a first converting circuit configured to convert the current signal via the trans-impedance amplifier and the RC circuit in a wide bandwidth mode, and a second converting circuit configured to convert the current signal via the RC circuit in a narrow bandwidth mode.

20 Claims, 11 Drawing Sheets

CURRENT-TO-VOLTAGE CONVERTER PROVIDING VARIABLE BANDWIDTH AND APPARATUS INCLUDING THE SAME

CROSS-REFERENCE TO THE RELATED APPLICATION

This application claims priority from Korean Patent Application No. 10-2018-0036607, filed on Mar. 29, 2018, in the Korean Intellectual Property Office, the disclosure of which is incorporated herein in its entirety by reference.

BACKGROUND

1. Field

Apparatuses and methods consistent with example embodiments relate to a current-to-voltage converter, and more particularly, to a current-to-voltage converter providing a variable bandwidth and an apparatus including the current-to-voltage converter.

2. Description of the Related Art

A process of processing a signal for wireless communication may include various operations. For example, a signal received through an antenna may be processed by amplification, filtering, mixing, etc., and information may be extracted from the processed signal. In addition, in order to transmit a signal through an antenna, a signal including information may be processed by amplification, filtering, mixing, etc., and the processed signal may be output through the antenna.

A bandwidth of a signal may be increased to increase a data throughput, and accordingly, a wireless communication device may be required to process a signal having a wide bandwidth without distortion. In addition, an application that consumes a large amount of power in a mobile device may be required to process a signal for wireless communication with decreased power.

SUMMARY

One or more example embodiments provide a current-to-voltage converter that supports a wide bandwidth and provides decreased power consumption by providing a variable bandwidth, and an apparatus including the current-to-voltage converter.

According to an aspect of an example embodiment, there is provided a current-to-voltage converter for converting a current signal into a voltage signal. The current-to-voltage converter may include: a trans-impedance amplifier including an input terminal and an output terminal; a resistor-capacitor (RC) circuit including a first end and a second end respectively connected to the input terminal and the output terminal of the trans-impedance amplifier, a resistor and a capacitor connected to each other in parallel between the first end and the second end; and a plurality of switches configured to form at least one of a first converting circuit configured to convert the current signal via the trans-impedance amplifier and the RC circuit in a wide bandwidth mode, and a second converting circuit configured to convert the current signal via the RC circuit in a narrow bandwidth mode.

According to an aspect of an example embodiment, there is provided a current-to-voltage converter for converting a current signal into a voltage signal. The current-to-voltage converter may include: a trans-impedance amplifier; a resistor-capacitor (RC) circuit including a resistor and a capacitor connected to each other in parallel; and a plurality of switches configured to perform at least one of applying the RC circuit as a feedback to the trans-impedance amplifier in a wide bandwidth mode, and applying the RC circuit as a shunt between the current signal and ground in a narrow bandwidth mode.

According to an aspect of an example embodiment, there is provided an apparatus including: a signal processor configured to output a control signal and a current signal in a baseband; and a transmitter including a current-to-voltage converter configured to operate in at least of a wide bandwidth mode and a narrow bandwidth mode according to the control signal and convert the current signal into a voltage signal. The transmitter may be configured to output a radio frequency (RF) signal based on the voltage signal. The current-to-voltage converter may include: a trans-impedance amplifier configured to power down in the narrow bandwidth mode; and a resistor-capacitor (RC) circuit including a resistor and a capacitor connected to each other in parallel and configured to allow at least a portion of the current signal to pass through in each of the wide bandwidth mode and the narrow bandwidth mode.

BRIEF DESCRIPTION OF THE DRAWINGS

The above and/or other aspects will become apparent and more readily appreciated from the following detailed description of example embodiments, taken in conjunction with the accompanying drawings in which.

DETAILED DESCRIPTION OF THE EMBODIMENTS

Figure 1:
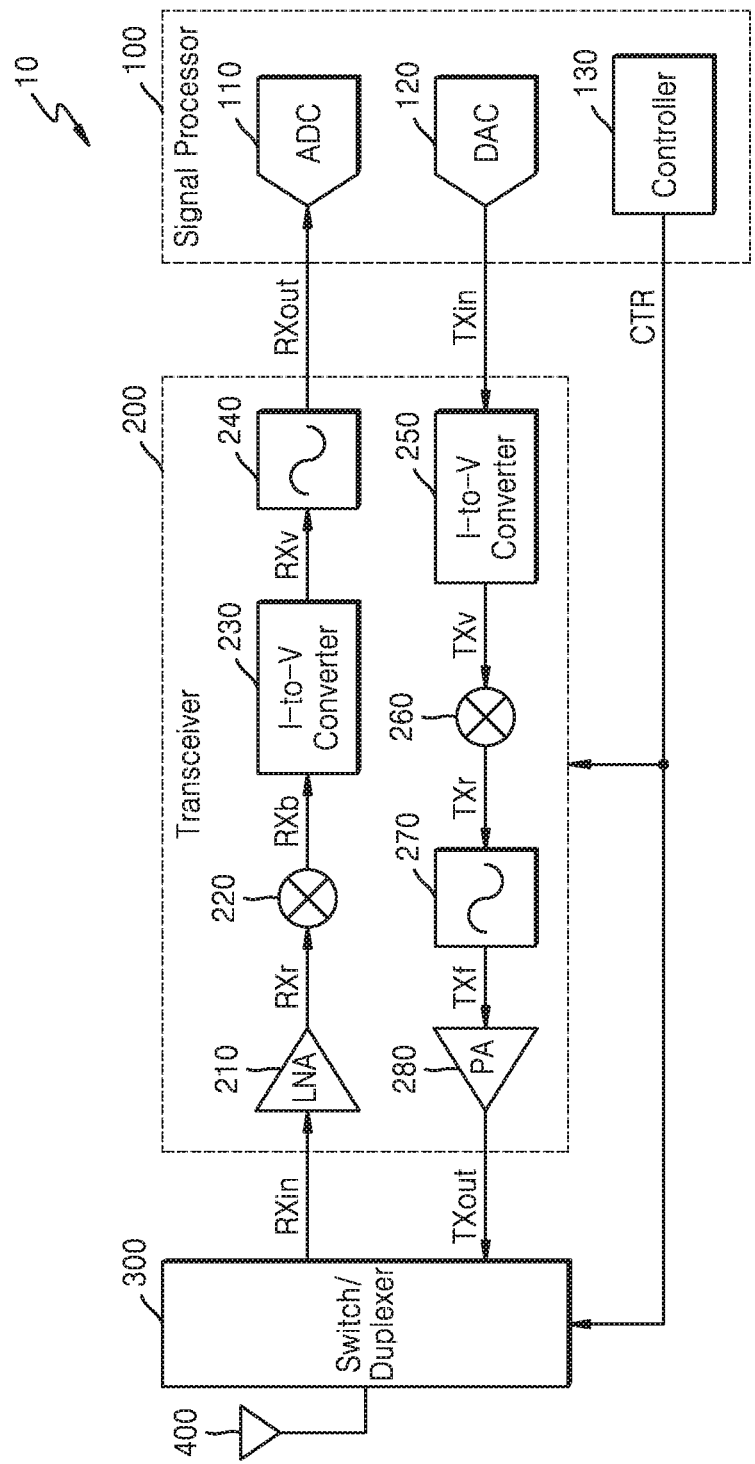
FIG. 1 is a block diagram illustrating an apparatus including a current-to-voltage converter according to an example embodiment.

Reference will now be made in detail to example embodiments, with reference to the accompanying drawings. In the drawings, parts irrelevant to the description are omitted to clearly describe the example embodiments, and like reference numerals refer to like elements throughout the specification. In this regard, the present example embodiments may have different forms and should not be construed as being limited to the descriptions set forth herein.

Throughout the specification, when it is described that a certain element is "connected" to another element, it should be understood that the certain element may be "directly connected" to another element or "electrically connected" to another element via another element in the middle. In addition, when a component "includes" an element, unless there is another opposite description thereto, it should be understood that the component does not exclude another element but may further include another element.

As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure is described in detail with reference to the accompanying drawings.

FIG. 1 is a block diagram illustrating an apparatus 10 including a current-to-voltage converter according to an example embodiment. The apparatus 10 may include an antenna 400, and communicate with another apparatus in a wireless communication system by transmitting or receiving a signal through the antenna 400. The apparatus 10 may be referred to as a wireless communication device.

The wireless communication system in which the apparatus 10 communicates with the other apparatus may be, as non-limiting examples, a wireless communication system using a cellular network, such as a fifth generation wireless (5G) system, a long term evolution (LTE) system, an LTE-advanced system, a code division multiple access (CDMA) system, or a global system for mobile communications (GSM) system, or may be a wireless local area network (WLAN) system or any other wireless communication system. Although the wireless communication system is described below mainly with reference to the WLAN system, it will be understood that example embodiments are not limited thereto.

As shown in FIG. 1, the apparatus 10 may include a signal processor 100, a transceiver 200, a switch/duplexer 300, and the antenna 400. The switch/duplexer 300 may provide a signal received through the antenna 400 to the transceiver 200 as an RX input signal RXin and may also provide a TX output signal TXout received from the transceiver 200 to the antenna 400.

The transceiver 200 may generate an RX output signal RXout by processing the RX input signal RXin and provide the RX output signal RXout to the signal processor 100. As shown in FIG. 1, the transceiver 200 may include a low noise amplifier (LNA) 210, an RX mixer 220, an RX current-to-voltage converter 230, and an RX filter 240 to process the RX input signal RXin. The LNA 210 may generate an RX RF signal RXr by amplifying the RX input signal RXin, and the RX mixer 220 may generate an RX baseband signal RXb from the RX RF signal RXr according to a local oscillation signal. The RX baseband signal RXb may be a current signal having a variable current level, and the RX current-to-voltage converter 230 may generate an RX voltage signal RXv having a variable voltage level by converting the RX baseband signal RXb. The RX filter 240 may generate the RX output signal RXout by removing undesired image artifacts from the RX voltage signal RXv.

The transceiver 200 may generate the TX output signal TXout by processing a TX input signal TXin received from the signal processor 100, and as shown in FIG. 1, may include a TX current-to-voltage converter 250, a TX mixer 260, a TX filter 270, and a power amplifier (PA) 280 to process the TX input signal TXin. The TX input signal TXin may be a current signal having a variable current level, and the TX current-to-voltage converter 250 may generate a TX voltage signal TXv having a variable voltage level by converting the TX input signal TXin at an input stage of a transmitting side of the transceiver 200. The TX mixer 260 may generate a TX RF signal TXr from the TX voltage signal TXv according to a local oscillation signal. The TX filter 270 may generate a TX filtered signal TXf by removing undesired image artifacts from the TX RF signal TXr, and the PA 280 may generate the TX output signal TXout by amplifying the TX filtered signal TXf.

Although FIG. 1 illustrates the transceiver 200 including two filters, for example, the RX and TX filters 240 and 270, in some embodiments, the transceiver 200 may further include at least one filter (for example, between the LNA 210 and the RX mixer 220). In addition, although FIG. 1 illustrates the apparatus 10 with the integrated transceiver 200 for both transmitting and receiving signals, in some embodiments, the apparatus 10 may include a transmitter and a receiver separate from each other.

As shown in FIG. 1, the signal processor 100 may include an analog-to-digital converter (ADC) 110, a digital-to-analog converter (DAC) 120, and a controller 130. The ADC 110 may output a digital signal by converting the RX output signal RXout, and information may be extracted from the digital signal output from the ADC 110 by digital signal processing, for example, filtering, demodulation, decoding, etc. The DAC 120 may output the TX input signal TXin by processing a digital signal through digital signal processing, for example, filtering, modulation, encoding, etc. The DAC converter 120 may output the TX input signal TXin as a current signal having a variable size according to a value of the digital signal.

The controller 130 may provide a control signal CTR to the transceiver 200 and/or the switch/duplexer 300. For example, the controller 130 may generate the control signal CTR to control the transceiver 200 and/or the switch/duplexer 300 according to a transmitting mode or a receiving mode. In addition, as described below, the controller 130 may set a bandwidth mode of the transceiver 200 through the control signal CTR. In some embodiments, the controller 130 may include a memory storing instructions which are executed by one or more cores of a processor, and at least a portion of the controller 130 may include a software block stored in the memory. In some embodiments, the controller 130 may include a logic circuit designed through logic synthesis, and at least a portion of the controller 130 may include a hardware block implemented with the logic circuit.

In some embodiments, the transceiver 200 may support a plurality of bandwidth modes respectively corresponding to a plurality of bandwidths of a baseband and may set one bandwidth mode according to the control signal CTR provided from the controller 130. For example, the transceiver 200 may support a wide bandwidth mode capable of processing a signal having a relatively wide bandwidth and a narrow bandwidth mode capable of processing a signal having a relatively narrow bandwidth, and may set the wide bandwidth mode or the narrow bandwidth mode according to the control signal CTR. Although example embodiments are described below with reference to two bandwidth modes, that is, the wide bandwidth mode and the narrow bandwidth mode, it will be understood that, in some embodiments, three or more bandwidth modes may be supported.

The wireless communication system may define a bandwidth of a signal transmitted through a wireless channel. The wireless communication system may define a bandwidth greater than an existing bandwidth as a new bandwidth to increase a data throughput provided through the wireless channel, and for example, Wi-Fi defines channels having different bandwidths, such as VHT80, VHT40, and HT20. Wireless communication devices supporting a wide bandwidth may provide a high data throughput, whereas, when one of two wireless communication devices wirelessly communicating with each other does not support a wide bandwidth, the two wireless communication devices may provide a low data throughput. Accordingly, a wireless communication device may be required to support various bandwidths defined by the wireless communication system for a legacy wireless communication device, as well as a wide bandwidth. Bandwidth information regarding a bandwidth that the wireless communication device may support may be mutually shared between wireless communication devices when a wireless channel is formed, and the signal processor 100 may set a bandwidth mode of the transceiver 200 through the control signal CTR according to the bandwidth information.

In some embodiments, at least one of the elements included in the transceiver 200 may operate differently according to a set bandwidth mode. For example, as described below with reference to the drawings, the RX current-to-voltage converter 230 and/or the TX current-to-voltage converter 250 may form different circuits, respectively, in the wide bandwidth mode and the narrow bandwidth mode, and thus, may process a signal having a wide bandwidth in the wide bandwidth mode and may provide decreased power consumption in the narrow bandwidth mode. In addition, as described below with reference to FIG. 2, at the input stage of the transceiver 200, the TX current-to-voltage converter 250 may effectively process the TX input signal TXin having a wide bandwidth. Thus, the degree of freedom in arranging the transceiver 200 and the signal processor 100 in the apparatus 10 may increase, and as a result, spatial efficiency of the apparatus 10 may improve. Although example embodiments are described below mainly with reference to the TX current-to-voltage converter 250 at the input stage of the transmitting side of the transceiver 200, the example embodiments are not limited thereto. Hereinafter, examples of the TX current-to-voltage converter 250 may be referred to as a current-to-voltage converter.

Figure 2:
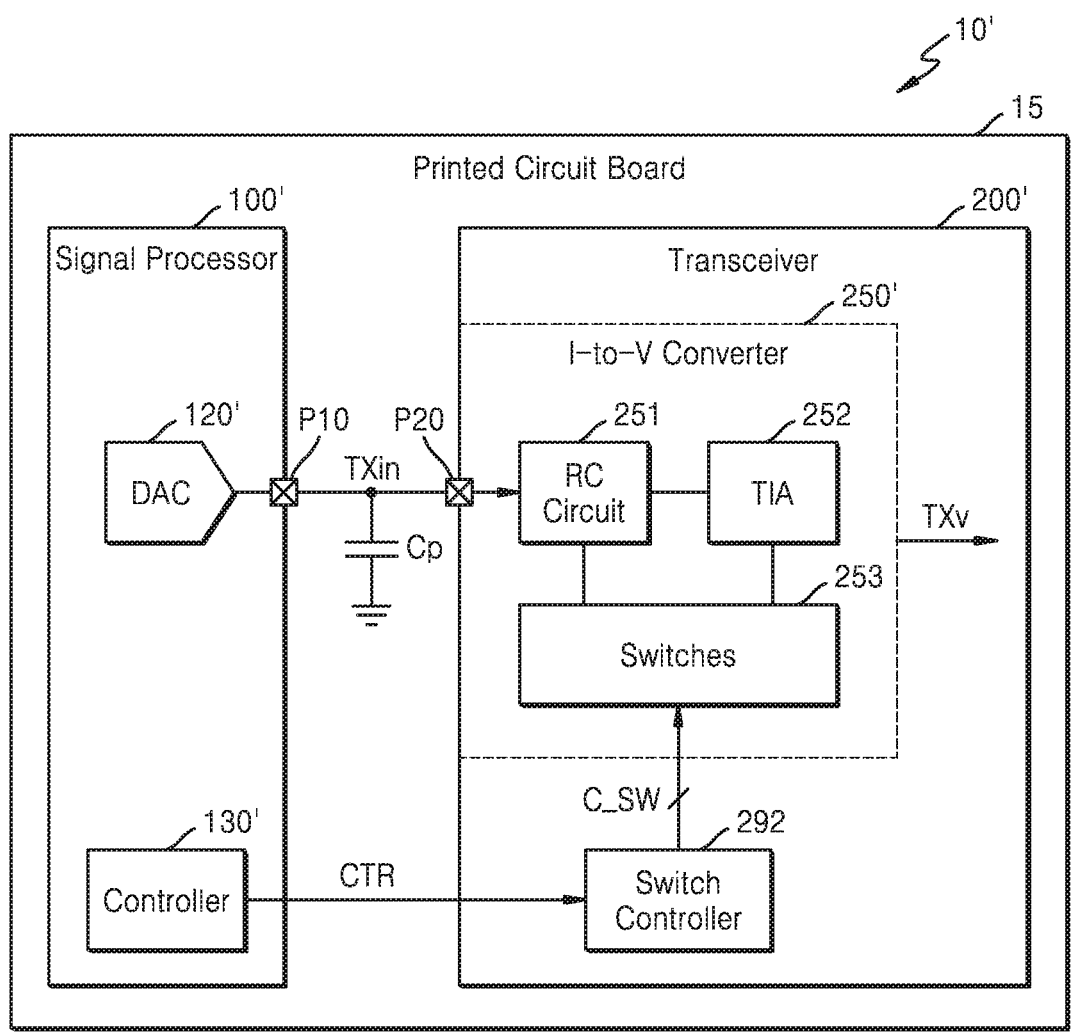
FIG. 2 is a diagram illustrating an example of the apparatus of FIG. 1 according to an example embodiment.

FIG. 2 is a diagram illustrating an example of the apparatus 10 of FIG. 1 according to an example embodiment. In particular, FIG. 2 illustrates an apparatus 10' including a signal processor 100' and a transceiver 200' mounted on a substrate such as a printed circuit board 15. As described above with reference to FIG. 1, the signal processor 100' of FIG. 2 may include a DAC 120' and a controller 130' and may provide the TX input signal TXin and the control signal CTR to the transceiver 200'.

Referring to FIG. 2, the signal processor 100' and the transceiver 200' may be separate from each other on the printed circuit board 15, and the TX input signal TXin may be transmitted from an output pin P10 of the signal processor 100' to an input pin P20 of the transceiver 200' through a pattern of the printed circuit board 15. Thus, the TX input signal TXin may experience parasitic capacitance due to the pattern of the printed circuit board 15, and as illustrated in FIG. 2, the parasitic capacitance may be modeled as a parasitic capacitor Cp. Owing to a structure of the apparatus 10', as a separation distance between the signal processor 100' and the transceiver 200' increases, a length of the pattern along which the TX input signal TXin propagates may increase, and thus, the parasitic capacitance may also increase. For example, in a wireless communication device required to have spatial efficiency (e.g., more components being fit within a smaller space), such as a mobile phone, it may be difficult to arrange the signal processor 100' and the transceiver 200' in close proximity to each other.

As described below, a current-to-voltage converter 250' receiving the TX input signal TXin in the transceiver 200' may output the TX voltage signal TXv by converting the TX input signal TXin having a wide bandwidth without distortion despite the parasitic capacitor Cp. Thus, the degree of freedom in arrangement of the signal processor 100' and the transceiver 200' in the apparatus 10' may increase, and spatial efficiency of the apparatus 10' may increase. In addition, since the TX voltage signal TXv may be output by converting the TX input signal TXin having a narrow bandwidth with low power, improved power efficiency may be provided. In some embodiments, the signal processor 100' and the transceiver 200' may be individual dies manufactured by semiconductor processes, and the printed circuit board 15 may be included in a chip package. In some embodiments, the signal processor 100' and the transceiver 200' may be individual chip packages.

The transceiver 200' may include the current-to-voltage converter 250' and a switch controller 292. The current-to-voltage converter 250' may receive the TX input signal TXin through the input pin P20 and may output the TX voltage signal TXv by converting the TX input signal TXin. In addition, the current-to-voltage converter 250' may receive a switch control signal C_SW from the switch controller 292, and as illustrated in FIG. 2, may include a resistor-capacitor (RC) circuit 251, a trans-impedance amplifier (TIA) 252, and switches 253.

The RC circuit 251 may include a passive device, for example, a resistor and a capacitor, and the resistor and the capacitor may be connected to each other in parallel. As illustrated in FIG. 2, the RC circuit 251 may receive the TX input signal TXin and may be connected to the TIA 252 and the switches 253. In some embodiments, the RC circuit 251 may be shared in a wide bandwidth mode and a narrow bandwidth mode, that is, may be used in both of the wide bandwidth mode and the narrow bandwidth mode. For example, at least a portion of the TX input signal TXin, which is a current signal, may pass through the RC circuit 251 in each of the wide bandwidth mode and the narrow bandwidth mode.

The TIA 252 may convert current into voltage, based on power provided from a power voltage, for example, a positive supply voltage (for example, VDD) and a negative supply voltage (for example, ground). The TIA 252 may have any structure for converting current into voltage based on a power voltage, and for example, the TIA 252 may include at least one operational amplifier. The TIA 252 may support a bandwidth equal to or greater than a bandwidth of a signal supported by the apparatus 10' and thus may effectively convert a current signal having a wide bandwidth into a voltage signal. In some embodiments, the TIA 252 may be powered up in the wide bandwidth mode and may be powered down in the narrow bandwidth mode.

According to the switch control signal C_SW, the switches 253 may form a first converting circuit (for example, CKTa of FIG. 3A) including the RC circuit 251 and the TIA 252 in the wide bandwidth mode and may form a second converting circuit (for example, CKTb of FIG. 3B) including the RC circuit 251 in the narrow bandwidth mode. Accordingly, in the wide bandwidth mode, the current-to-voltage converter 250' may effectively convert a signal having a wide bandwidth, whereas, in the narrow bandwidth mode, the current-to-voltage converter 250' may consume decreased power owing to the TIA 252, etc. that are powered down.

The switch controller 292 may generate the switch control signal C_SW according to the control signal CTR indicating the wide bandwidth mode or the narrow bandwidth mode. For example, each of the switches 253 may include a transistor connecting both ends according to a gate voltage, for example, an N-type metal-oxide-semiconductor (NMOS) transistor and/or a P-type metal-oxide-semiconductor (PMOS) transistor, and the switch controller 292 may control a gate voltage of the transistor through the switch control signal C_SW. By turning on or turning off at least some of the switches 253 in each of the wide bandwidth mode and the narrow bandwidth mode, the switch controller 292 may provide the switch control signal C_SW to form the first converting circuit or the second converting circuit in the current-to-voltage converter 250'.

Figure 3A:
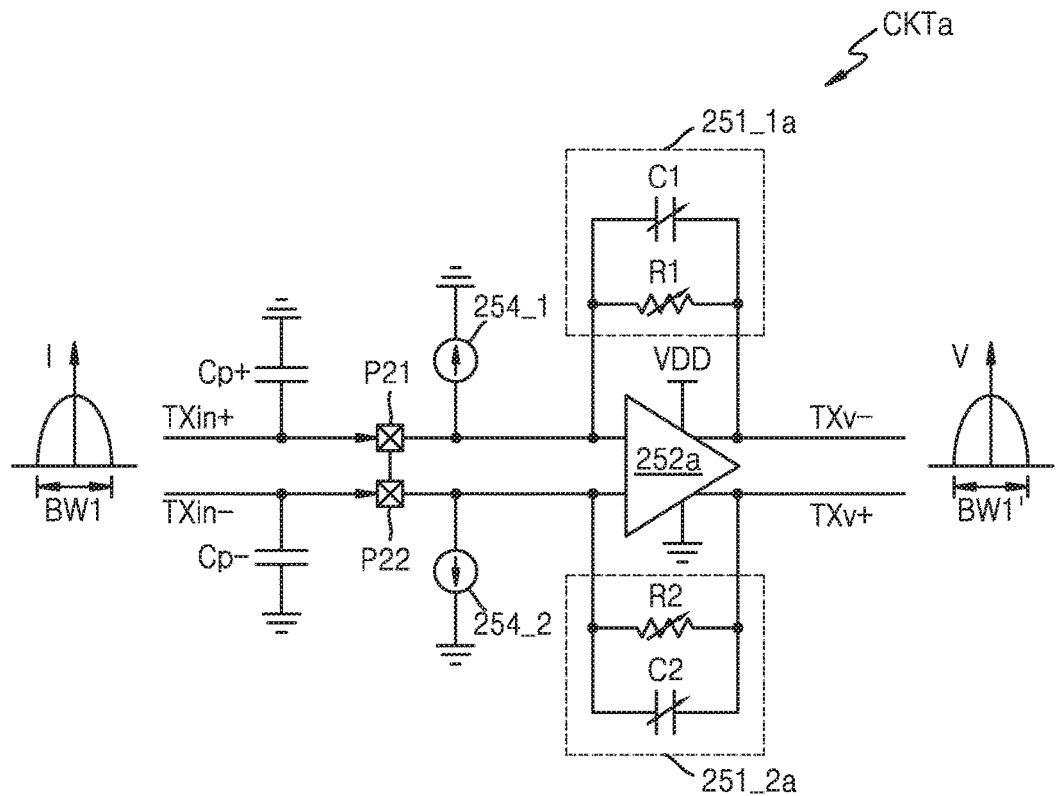
FIGS. 3A and 3B are circuit diagrams illustrating equivalent circuits in a current-to-voltage converter of FIG. 2 according to example embodiments.
Figure 3B:
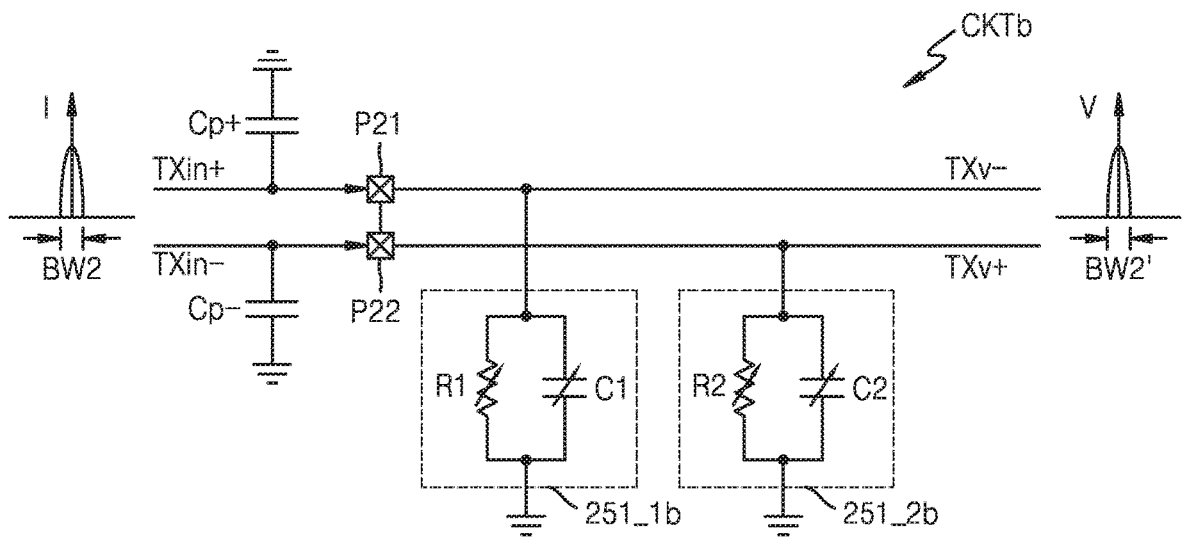

FIGS. 3A and 3B are circuit diagrams illustrating equivalent circuits in the current-to-voltage converter 250' of FIG. 2 according to example embodiments. In particular, FIG. 3A illustrates an equivalent circuit CKTa of the current-to-voltage converter 250' in a case in which the current-to-voltage converter 250' is set to a wide bandwidth mode, and FIG. 3B illustrates an equivalent circuit CKTb of the current-to-voltage converter 250' in a case in which the current-to-voltage converter 250' is set to a narrow bandwidth mode. As described above with reference to FIG. 2, the switches 253 may form a first converting circuit in the wide bandwidth mode and may form a second converting circuit in the narrow bandwidth mode, and thus, the equivalent circuit CKTa of FIG. 3A may be referred to as the first converting circuit and the equivalent circuit CKTb of FIG. 3B may be referred to as the second converting circuit. As illustrated in FIGS. 3A and 3B, the TX input signal TXin of FIG. 2 may be differential signals TXin+, TXin− received through first and second input pins P21 and P22, and the TX voltage signal TXv may also be differential signals TXv+, TXv−. A redundant description of FIGS. 3A and 3B is omitted below, and FIGS. 3A and 3B will be described with reference to FIG. 2.

Referring to FIG. 3A, the first converting circuit CKTa may include a first RC circuit 251_1a, a second RC circuit 251_2a, a TIA 252a, a first current source 254_1, and a second current source 254_2. The first converting circuit CKTa may generate the TX voltage signals TXv+, TXv− having a bandwidth BW1' by converting the TX input signals TXin+, TXin− having a bandwidth BW1. The first converting circuit CKTa may support a bandwidth greater than the bandwidth BW1, and thus, the bandwidth BW1 of the TX input signals TXin+, TXin− and the bandwidth BW1' of the TX voltage signals TXv+, TXv− may be identical. Owing to amplification caused by the TIA 252a, distortion (or attenuation) of the TX input signals TXin+, TXin− caused by parasitic capacitors Cp+, Cp− may be compensated for, and thus, the TX voltage signals TXv+, TXv− having the bandwidth BW1', which is relatively wide, may be effectively generated. In some embodiments, the first converting circuit CKTa may support a bandwidth of 120 MHz or greater.

In the first converting circuit CKTa, the first RC circuit 251_1a and the second RC circuit 251_2a may be added to a feedback path of the TIA 252a. That is, as illustrated in FIG. 3A, the first RC circuit 251_1a and the second RC circuit 251_2a may each have an end connected to an input terminal of the TIA 252a and an end connected to an output terminal of the TIA 252a. Accordingly, the positive TX input signal TXin+ may be applied to one end of the first RC circuit 251_1a, and the negative TX voltage signal TXv− may be output from the other end of the first RC circuit 251_1a. In addition, the negative TX input signal TXin− may be applied to one end of the second RC circuit 251_2a, and the positive TX voltage signal TXv+ may be output from the other end of the second RC circuit 251_2a.

The first RC circuit 251_1a may include a first resistor R1 and a first capacitor C1 connected to each other in parallel and the second RC circuit 251_2a may include a second resistor R2 and a second capacitor C2 connected to each other in parallel. In some embodiments, as illustrated in FIG. 3A, the first resistor R1 and the second resistor R2 may be variable resistors, and the first capacitor C1 and the second capacitor C2 may be variable capacitors.

The first current source 254_1 and the second current source 254_2 may withdraw direct current (DC) from the TX input signals TXin+, TXin−. That is, the first current source 254_1 and the second current source 254_2 may withdraw common mode current of the TX input signals TXin+, TXin−, which are differential signals, as a DC current source. Accordingly, currents having the common mode current removed from the TX input signals TXin+, TXin− may be applied to input terminals of the TIA 252a.

Referring to FIG. 3B, the second converting circuit CKTb may include a first RC circuit 251_1b and a second RC circuit 251_2b. The second converting circuit CKTb may have a shunt resistor structure, and the second converting circuit CKTb may generate the TX voltage signals TXv+, TXv− having a bandwidth BW2' by converting the TX input signals TXin+, TXin− having a bandwidth BW2. In some embodiments, the second converting circuit CKTb may support a bandwidth of 50 MHz or less.

In the second converting circuit CKTb, the first RC circuit 251_1b and the second RC circuit 251_2b may be added to a shunt between the TX input signals TXin+, TXin− and ground. That is, the first RC circuit 251_1b and the second RC circuit 251_2b may each have an end to which the TX input signals TXin+, TXin− are respectively applied and another end connected to the ground. Accordingly, the TX input signals TXin+, TXin−, which are current signals, may flow to the ground through the first RC circuit 251_1b and the second RC circuit 251_2b, and the TX voltage signals TXv+, TXv− may be generated at respective ends of the second RC circuit 251_2b and the first RC circuit 251_1b.

As described below with reference to FIG. 4, in the first converting circuit CKTa of FIG. 3A and the second converting circuit CKTb of FIG. 3B, the first RC circuits 251_1a and 251_1b and the second RC circuits 251_2a and 251_2b may be respectively implemented as one first RC circuit and one second RC circuit by the switches 253. In addition, in the second converting circuit CKTb of FIG. 3B, the TIA 252a, the first current source 254_1, and the second current source 254_2 of FIG. 3A may not contribute to conversion of the TX input signals TXin+, TXin−, and in some embodiments, may be powered down. Although not illustrated in FIGS. 3A and 3B, for protection against electrostatic discharge (ESD) from the first and second input pins P21 and P22, a resistor connected between the first input pin P21 and the first RC circuits 251_1a and 251_1b and a resistor connected between the second input pin P22 and the second RC circuits 251_2a and 251_2b may be added in some embodiments.

Figure 4:
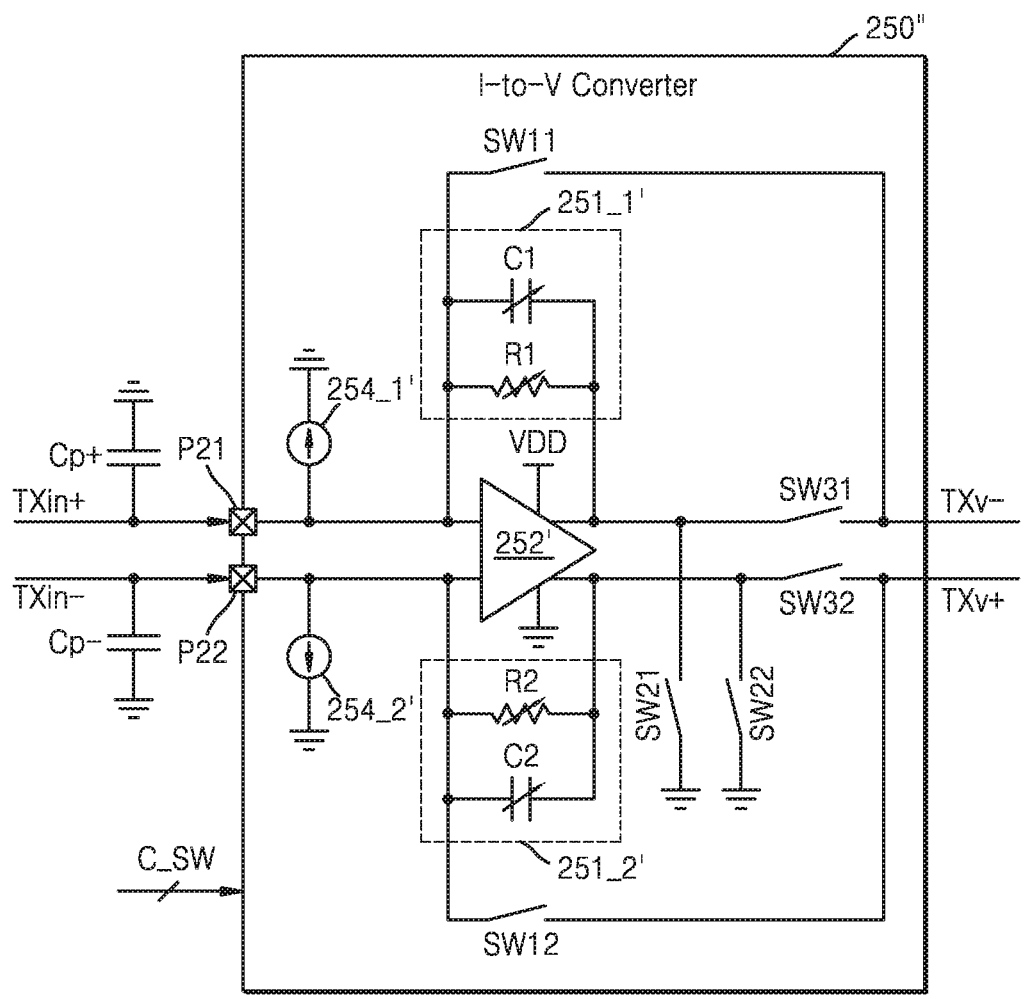
FIG. 4 is a block diagram illustrating a current-to-voltage converter according to an example embodiment.
Figure 5:
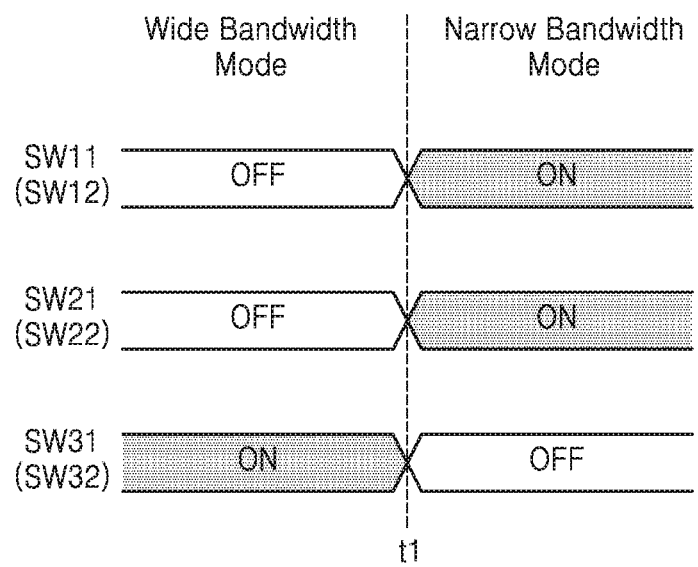
FIG. 5 is a timing diagram illustrating states of a plurality of switches included in the current-to-voltage converter of FIG. 4 according to a bandwidth mode.

FIG. 4 is a block diagram illustrating a current-to-voltage converter 250" according to an example embodiment. FIG. 5 is a timing diagram illustrating states of a plurality of switches SW11, SW12, SW21, SW22, SW31, and SW32 included in the current-to-voltage converter 250" of FIG. 4 according to a bandwidth mode. In particular, FIG. 4 illustrates the current-to-voltage converter 250" including the plurality of switches SW11, SW12, SW21, SW22, SW31, and SW32 forming the first converting circuit CKTa of FIG. 3A or the second converting circuit CKTb of FIG. 3B according to a bandwidth mode, and FIG. 5 illustrates states of the plurality of switches SW11, SW12, SW21, SW22, SW31, and SW32, that is, a state in which both ends are electrically connected to each other (ON) or a state in which both ends are electrically disconnected from each other (OFF), according to a bandwidth mode. Although a path where the negative TX voltage signal TXv− is generated by converting the positive TX input signal TXin+ is mainly described below, it will be understood that a description thereof is applied in the same way or a similar way to a path where the positive TX voltage signal TXv+ is generated by converting the negative TX input signal TXin−.

Referring to FIG. 4, the current-to-voltage converter 250" may include a first RC circuit 251_1', a second RC circuit 251_2', a TIA 252', a first current source 254_1', a second current source 254_2', and the plurality of switches SW11, SW12, SW21, SW22, SW31, and SW32. The first RC circuit 251_1' may include the first resistor R1 and the first capacitor C1 connected to each other in parallel, and the second RC circuit 251_2' may include the second resistor R2 and the second capacitor C2 connected to each other in parallel. Referring to FIG. 4, the first RC circuit 251_1' may have a first end and a second end respectively connected to an input terminal and an output terminal of the TIA 252'.

Each of the plurality of switches SW11, SW12, SW21, SW22, SW31, and SW32 may be in an on-state or an off-state according to the switch control signal C_SW. From among the plurality of switches SW11, SW12, SW21, SW22, SW31, and SW32, the first switches SW11 and SW12 may be controlled in the same way, the second switches SW21 and SW22 may be controlled in the same way, and the third switches SW31 and SW32 may be controlled in the same way. Referring to FIG. 4, the first switch SW11 may be connected between the first end of the first RC circuit 251_1' connected to the input terminal of the TIA 252' and a negative output node where the negative TX voltage signal TXv− is output. The second switch SW21 may be connected between the second end of the first RC circuit 251_1' connected to the output terminal of the TIA 252' and ground. The third switch SW31 may be connected between the second end of the first RC circuit 251_1' and the negative output node.

Referring to FIG. 5, in a wide bandwidth mode until a time t1, the first switches SW11 and SW12 may be in an off-state, the second switches SW21 and SW22 may also be in an off-state, and the third switches SW31 and SW32 may be in an on-state. Accordingly, the first converting circuit CKTa of FIG. 3A may be formed, the TX input signals TXin+, TXin− may be converted into the TX voltage signals TXv+, TXv− by the TIA 252', and the first RC circuit 251_1' and the second RC circuit 251_2' may be on a feedback path.

In a narrow bandwidth mode after the time t1, the first switches SW11 and SW12 may be in an on-state, the second switches SW21 and SW22 may also be in an on-state, and the third switches SW31 and SW32 may be in an off-state. Accordingly, the second converting circuit CKTb of FIG. 3B may be formed, and the TX input signals TXin+, TXin− may be converted into the TX voltage signals TXv+, TXv− by the first RC circuit 251_1' and the second RC circuit 251_2'.

FIGS. 6A to 6D are diagrams illustrating examples of the switch controller 292 of FIG. 2 according to example embodiments. As described above with reference to FIG. 2, switch controllers 292a, 292b, 292c, and 292d of FIGS. 6A to 6D may output the switch control signal C_SW according to the control signal CTR and may each be referred to as a mode controller. FIGS. 6A to 6D are described below with reference to the current-to-voltage converter 250" of FIG. 4 as an example of the current-to-voltage converter 250' of FIG. 2.

Figure 6A:
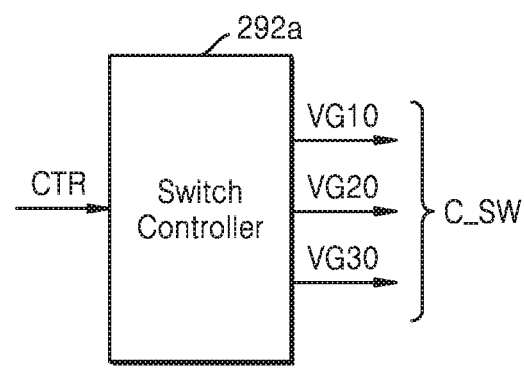
FIGS. 6A to 6D are diagrams illustrating examples of a switch controller of FIG. 2 according to example embodiments.

Referring to FIG. 6A, in some embodiments, each of the plurality of switches SW11, SW12, SW21, SW22, SW31, and SW32 included in the current-to-voltage converter 250" of FIG. 4 may include a transistor. According to the control signal CTR, the switch controller 292a may output gate voltages VG10, VG20, and VG30, which are provided to transistors, as the switch control signal C_SW. For example, when each of the plurality of switches SW11, SW12, SW21, SW22, SW31, and SW32 includes an NMOS transistor, the switch controller 292a may turn on the switch by outputting a gate voltage having a high level and may turn off the switch by outputting a gate voltage having a low level. As described above with reference to FIG. 4, the first switches SW11 and SW12 may be controlled in the same way, the second switches SW21 and SW22 may be controlled in the same way, and the third switches SW31 and SW32 may be controlled in the same way. Accordingly, the first gate voltage VG10 may be provided to the first switches SW11 and SW12, the second gate voltage VG20 may be provided to the second switches SW21 and SW22, and the third gate voltage VG30 may be provided to the third switches SW31 and SW32.

Figure 6B:
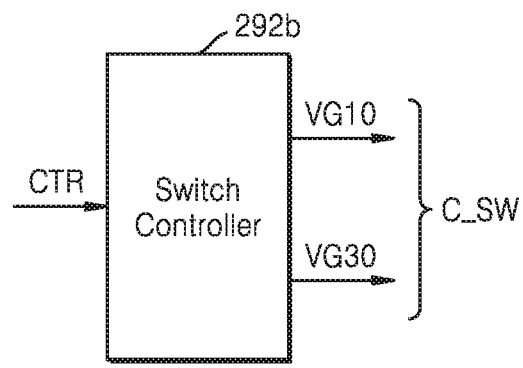

Referring to FIG. 6B, according to the control signal CTR, the switch controller 292b may output the first gate voltage VG10 and the third gate voltage VG30 as the switch control signal C_SW. As described above with reference to FIG. 5, the first switches SW11 and SW12 and the second switches SW21 and SW22 of the plurality of switches SW11, SW12, SW21, SW22, SW31, and SW32 are in an off-state in a wide bandwidth mode and are in an on-state in a narrow bandwidth mode, and thus, may be controlled in the same way. Accordingly, the switch controller 292b may output only the first gate voltage VG10 and the third gate voltage VG30, and the first gate voltage VG10 may be commonly provided to the first switches SW11 and SW12 and the second switches SW21 and SW22.

Figure 6C:
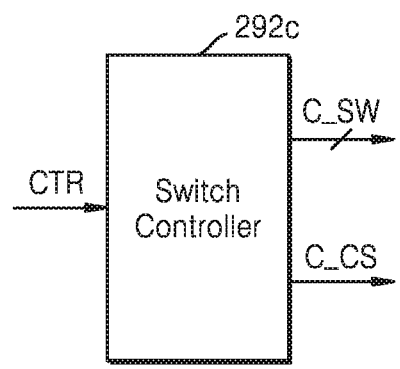

Referring to FIG. 6C, according to the control signal CTR, the switch controller 292c may output not only the switch control signal C_SW but also a current source control signal C_CS. As described above with reference to FIGS. 3A and 3B, the first current source 254_1' and the second current source 254_2' of FIG. 4 may withdraw common mode current of the TX input signals TXin+, TXin− in a wide bandwidth mode, and may not contribute to a converting operation of the current-to-voltage converter 250" in a narrow bandwidth mode.

The first current source 254_1' and the second current source 254_2' may commonly receive the current source control signal C_CS from the switch controller 292c. For example, the switch controller 292c may output the current source control signal C_CS that is activated, in response to the control signal CTR indicating the wide bandwidth mode, and the first current source 254_1' and the second current source 254_2' may withdraw common mode current of the TX input signals TXin+, TXin− in response to the activated current source control signal C_CS. On the other hand, the switch controller 292c may output the current source control signal C_CS that is inactivated, in response to the control signal CTR indicating the narrow bandwidth mode, and the first current source 254_1' and the second current source 254_2' may stop withdrawing current, for example, by being powered down, in response to the inactivated current source control signal C_CS.

Figure 6D:
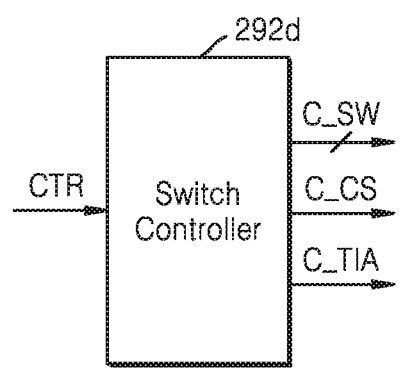

Referring to FIG. 6D, according to the control signal CTR, the switch controller 292d may output not only the switch control signal C_SW and the current source control signal C_CS but also a TIA control signal C_TIA. As described above with reference to FIGS. 3A and 3B, the TIA 252' of FIG. 4 may perform an amplifying operation based on power provided from a positive supply voltage VDD and ground in a wide bandwidth mode and may not contribute to a converting operation of the current-to-voltage converter 250" in a narrow bandwidth mode.

The TIA 252' may receive the TIA control signal C_TIA from the switch controller 292d. For example, the switch controller 292d may output the TIA control signal C_TIA that is activated, in response to the control signal CTR indicating the wide bandwidth mode, and the TIA 252' may perform an amplifying operation in response to the activated TIA control signal C_TIA. On the other hand, the switch controller 292d may output the TIA control signal C_TIA that is inactivated, in response to the control signal CTR indicating the narrow bandwidth mode, and the TIA 252' may stop the amplifying operation, for example, by powering down, in response to the inactivated TIA control signal C_TIA. In some embodiments, the TIA 252' may include a power switch added to a path where current moves between the power supply voltage VDD and the ground, and the power switch may be turned on in response to the activated TIA control signal C_TIA and may be turned off in response to the inactivated TIA control signal C_TIA.

Figure 7:
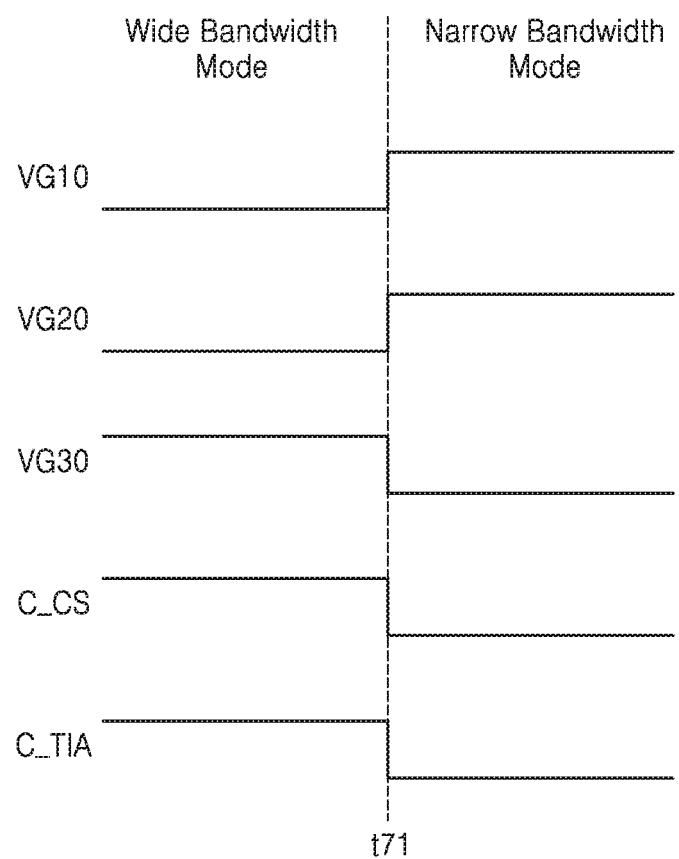
FIG. 7 is a timing diagram illustrating an example of signals output by a switch controller of FIG. 6D according to an example embodiment.

FIG. 7 is a timing diagram illustrating an example of signals output by the switch controller 292d of FIG. 6D according to an example embodiment. In the example of FIG. 7, switches receiving the switch control signal C_SW from the switch controller 292d are assumed to be NMOS transistors, and an activated signal and an inactivated signal are assumed to respectively have a high level and a low level. FIG. 7 is described below with reference to the current-to-voltage converter 250" of FIG. 4 and the switch controller 292d of FIG. 6D.

Referring to FIG. 7, in a wide bandwidth mode until a time t71, the first gate voltage VG10 and the second gate voltage VG20 may maintain a low level, whereas the third gate voltage VG30 may maintain a high level. Accordingly, the first switches SW11 and SW12 and the second switches SW21 and SW22 of FIG. 4 may maintain an off-state, whereas the third switches SW31 and SW32 may maintain an on-state. In addition, the current source control signal C_CS and the TIA control signal C_TIA may maintain a high level until the time t71, and thus, the first current source 254_1' and the second current source 254_2' may withdraw common mode current of the TX input signals TXin+, TXin−, and the TIA 252' may perform an amplifying operation.

In a narrow bandwidth mode after the time t71, the first gate voltage VG10 and the second gate voltage VG20 may maintain a high level, whereas the third gate voltage VG30 may maintain a low level. Accordingly, the first switches SW11 and SW12 and the second switches SW21 and SW22 of FIG. 4 may maintain an on-state, whereas the third switches SW31 and SW32 may maintain an off-state. In addition, the current source control signal C_CS and the TIA control signal C_TIA may maintain a low level, and thus, the first current source 254_1', the second current source 254_2', and the TIA 252' may not contribute to a converting operation of the current-to-voltage converter 250".

In some embodiments, a gate voltage for turning on a switch may be equal to or greater than a positive supply voltage (for example, VDD) to decrease on-resistance of an on-state switch. For example, the gate voltages VG10 and VG30 greater than the positive supply voltage may be respectively provided to turn on the first switches SW11 and SW12 and the third switches SW31 and SW32 of FIG. 4. In some embodiments, owing to output of the TIA 252', that is, common mode voltage of the TX voltage signals TXv−, TXv+, the gate voltage VG30 for turning on the third switches SW31 and SW32 may be greater than the gate voltage VG10 for turning on the first switches SW11 and SW12.

Figure 8:
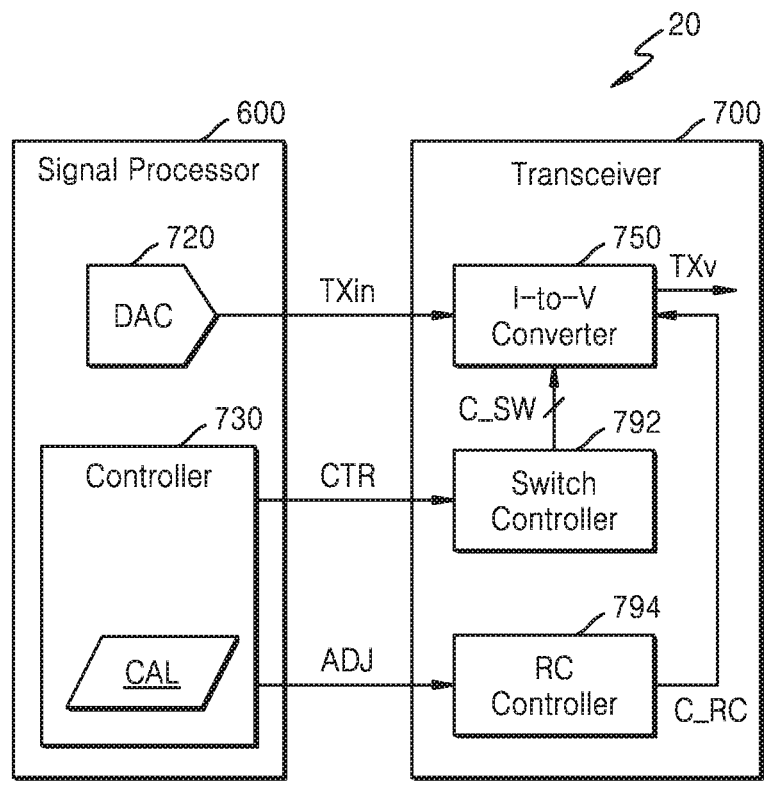
FIG. 8 is a block diagram illustrating an apparatus according to an example embodiment.

FIG. 8 is a block diagram illustrating an apparatus 20 according to an example embodiment. As illustrated in FIG. 1, the apparatus 20 may include a signal processor 600 and a transceiver 700. Compared to the apparatus 10 of FIG. 1, in the apparatus 20 of FIG. 8, the transceiver 700 may include an RC controller 794, and the RC controller 794 may receive an adjustment signal ADJ from a controller 730 of the signal processor 600. A description of the apparatus 20 of FIG. 8 overlapping that of the apparatus 10 of FIG. 1 is omitted below, and a current-to-voltage converter 750 of FIG. 8 is described below with reference to the current-to-voltage converter 250" of FIG. 4.

The signal processor 600 may include a DAC 720 and the controller 730. The DAC 720 may provide the TX input signal TXin having a variable current level to the transceiver 700. The controller 730 may provide not only the control signal CTR for setting a bandwidth mode but also the adjustment signal ADJ for adjusting a resistance value and/or a capacitance of a resistor and/or a capacitor included in the current-to-voltage converter 750 to the transceiver 700. For example, as illustrated in FIG. 8, the controller 730 may include calibration data CAL including information regarding a plurality of resistance values and/or a plurality of capacitances of a resistor and/or a capacitor included in the current-to-voltage converter 750, and may generate the adjustment signal ADJ based on the calibration data CAL.

In some embodiments, the calibration data CAL may be generated as a result of a calibration operation performed by the apparatus 20 during a manufacturing process of the apparatus 20 and may be included in the controller 730. In some embodiments, the calibration data CAL may be predefined during a manufacturing process of the apparatus 20 and may be injected (e.g., preloaded) into the controller 730. In some embodiments, the controller 730 may include non-volatile memory, for example, flash memory, and the calibration data CAL may be stored in the non-volatile memory. In some embodiments, unlike that illustrated in FIG. 8, the calibration data CAL may be stored in a storage outside the controller 730 or outside the signal processor 600, and the controller 730 may obtain the calibration data CAL by accessing the storage.

The transceiver 700 may include the current-to-voltage converter 750, a switch controller 792, and the RC controller 794. The current-to-voltage converter 750 may output the TX voltage signal TXv by converting the TX input signal TXin. In addition, the current-to-voltage converter 750 may receive the switch control signal C_SW from the switch controller 792 and may receive an RC control signal C_RC from the RC controller 794. The switch controller 792 may set a bandwidth mode of the current-to-voltage converter 750 by outputting the switch control signal C_SW according to the control signal CTR.

The RC controller 794 may output the RC control signal C_RC according to the adjustment signal ADJ. A resistance value and/or a capacitance of a resistor (for example, R1, R2 of FIG. 4) and/or a capacitor (for example, C1, C2 of FIG. 4) included in the current-to-voltage converter 750 may change according to the RC control signal C_RC. For example, parasitic capacitance of a pattern along which the TX input signal TXin propagates may vary by device, and when the current-to-voltage converter 750 is manufactured by a semiconductor process, characteristics (for example, gain, bandwidth, etc.) of the current-to-voltage converter 750 may change according to process voltage temperature (PVT) variation. Accordingly, desired characteristics of the current-to-voltage converter 750 may be obtained by adjusting the resistance value and/or the capacitance of the resistor and/or the capacitor of the current-to-voltage converter 750.

In some embodiments, the controller 730 may generate not only the control signal CTR but also the adjustment signal ADJ according to a bandwidth mode of the current-to-voltage converter 750. For example, capacitances of the first capacitor C1 and the second capacitor C2 in the first converting circuit CKTa of FIG. 3A may be different from capacitances of the first capacitor C1 and the second capacitor C2 in the second converting circuit CKTb of FIG. 3B. Accordingly, the controller 730 may generate the adjustment signal ADJ to allow the first capacitor C1 and the second capacitor C2 to have proper capacitances according to the bandwidth mode. An example of changing a capacitance of a capacitor included in the current-to-voltage converter 750 according to a bandwidth mode is described below with reference to FIG. 9.

Figure 9:
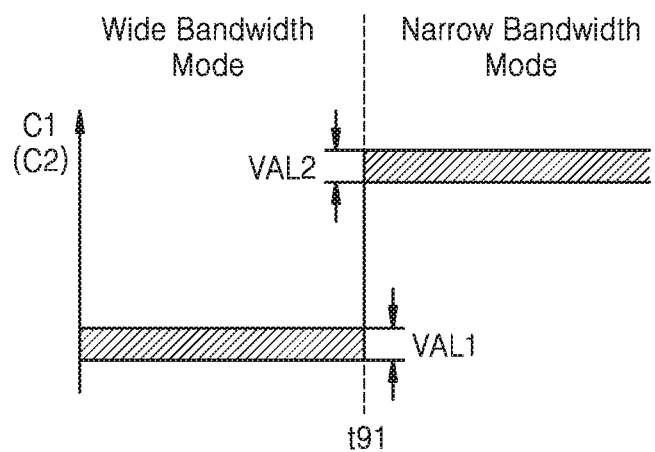
FIG. 9 is a timing diagram illustrating an example of changing a capacitance of a capacitor included in a current-to-voltage converter according to a bandwidth mode according to an example embodiment.

FIG. 9 is a timing diagram illustrating an example of changing a capacitance of a capacitor included in a current-to-voltage converter according to a bandwidth mode according to an example embodiment. In particular, FIG. 9 illustrates an example of changing capacitances of the first capacitor C1 and the second capacitor C2 of FIG. 4. As described above with reference to FIG. 8, capacitances of the first capacitor C1 and the second capacitor C2 may change according to the RC control signal C_RC.

Referring to FIG. 9, in a wide bandwidth mode until a time t91, capacitances of the first capacitor C1 and the second capacitor C2 may be in a first range VAL1 which is relatively low. In a narrow bandwidth mode after the time t91, capacitances of the first capacitor C1 and the second capacitor C2 may be in a second range VAL2 which is relatively high (i.e., higher than VAL1). In some embodiments, the first capacitor C1 and the second capacitor C2 may commonly receive the RC control signal C_RC, and in some embodiments, may be mutually independently controlled by respectively receiving two signals included in the RC control signal C_RC. Although FIG. 9 illustrates the first range VAL1 and the second range VAL2 not overlapping each other, in some embodiments, the first range VAL1 and the second range VAL2 may at least partially overlap each other.

Figure 10:
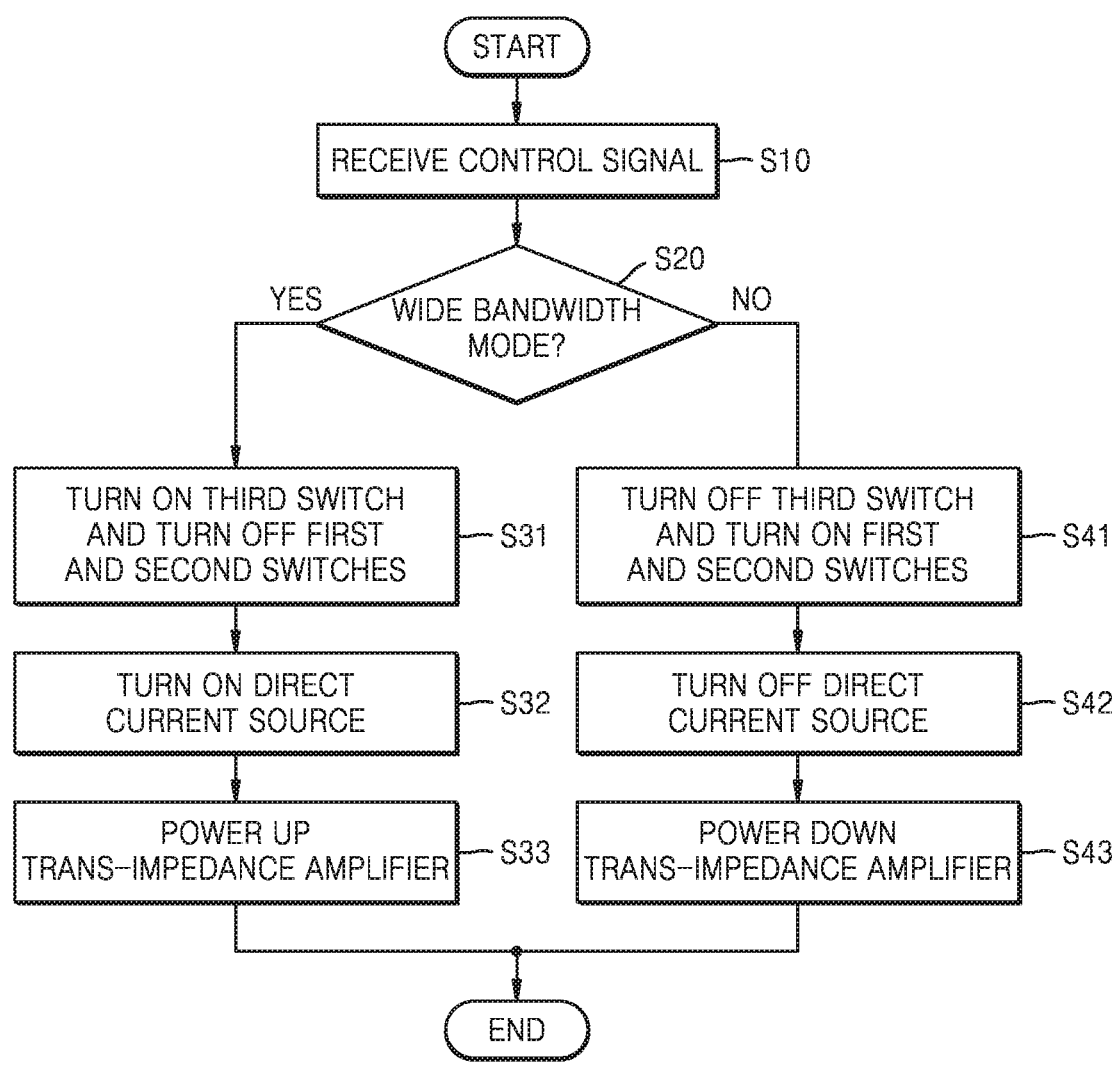
FIG. 10 is a flowchart illustrating a method of setting a bandwidth mode of a current-to-voltage converter, according to an example embodiment.

FIG. 10 is a flowchart illustrating a method of setting a bandwidth mode of a current-to-voltage converter, according to an example embodiment. For example, the method of FIG. 10 may be performed by the switch controller 292 of FIG. 2. FIG. 10 is described below with reference to the switch controller 292 of FIG. 2 and the current-to-voltage converter 250" of FIG. 4.

In operation S10, an operation of receiving the control signal CTR may be performed. For example, the switch controller 292 may receive the control signal CTR from the signal processor 100'. In operation S20, whether or not the control signal CTR indicates a wide bandwidth mode may be determined. When the control signal CTR indicates a wide bandwidth mode, operations S31, S32, and S33 may be performed subsequently to form the first converting circuit CKTa of FIG. 3A, whereas, when the control signal CTR indicates a narrow bandwidth mode, operations S41, S42, and S43 may be performed subsequently to form the second converting circuit CKTb of FIG. 3B. In some embodiments, operations S31, S32, and S33 may be performed in an order different from that illustrated in FIG. 10, and at least two operations thereof may be performed simultaneously. In some embodiments, operations S41, S42, and S43 may be performed in an order different from that illustrated in FIG. 10, and at least two operations thereof may be performed simultaneously.

In operation S31, a third switch may be turned on and the first and second switches may be turned off. For example, the first switches SW11 and SW12 and the second switches SW21 and SW22 of FIG. 4 may be turned off, and the third switches SW31 and SW32 may be turned on. The first switch, the second switch, and the third switch may respectively be turned on or off at the same time or at different times from each other.

In operation S32, a DC current source may be turned on. For example, the switch controller 292 may output a current source control signal (for example, C_CS of FIG. 6D) for controlling the first current source 254_1' and the second current source 254_2' of FIG. 4, and the first current source 254_1' and the second current source 254_2' may be turned on in response to the current source control signal that has been activated. In some embodiments, turning on the first current source 254_1' and the second current source 254_2' may refer to electrically connecting the first current source 254_1' and the second current source 254_2' to a path along which the TX input signals TXin+, TXin− propagate. In some embodiments, turning on the first current source 254_1' and the second current source 254_2' may refer to powering up the first current source 254_1' and the second current source 254_2'. Accordingly, the first current source 254_1' and the second current source 254_2' may withdraw common mode current from the TX input signals TXin+, TXin−.

In operation S33, an operation of powering up a TIA may be performed. For example, the switch controller 292 may output a TIA control signal (for example, C_TIA of FIG. 6D) for controlling the TIA 252' of FIG. 4, and the TIA 252' may be powered up in response to the TIA control signal that is activated. Accordingly, the TIA 252' may perform an amplifying operation, and as a result, the first converting circuit CKTa of FIG. 3A may be formed in the current-to-voltage converter 250'.

In operation S41, a third switch may be turned off and the first and second switches may be turned on. For example, the first switches SW11 and SW12 and the second switches SW21 and SW22 of FIG. 4 may be turned on, and the third switches SW31 and SW32 may be turned off. The first switch, the second switch, and the third switch may respectively be turned on or turned off at the same time or at different times from each other.

In operation S42, an operation of turning off a DC current source may be performed. For example, the first current source 254_1' and the second current source 254_2' of FIG. 4 may be turned off in response to an inactivated current source control signal (for example, C_CS of FIG. 6D) received from the switch controller 292. In some embodiments, turning off the first current source 254_1' and the second current source 254_2' may refer to electric disconnection from a path where the TX input signals TXin+, TXin− move. In some embodiments, turning off the first current source 254_1' and the second current source 254_2' may refer to powering down the first current source 254_1' and the second current source 254_2'. Accordingly, the first current source 254_1' and the second current source 254_2' may stop withdrawing common mode current from the TX input signals TXin+, TXin− and may not contribute to a converting operation of the TX input signals TXin+, TXin−. In addition, when the first current source 254_1' and the second current source 254_2' are powered down, power consumption caused by the first current source 254_1' and the second current source 254_2' may decrease compared to the wide bandwidth mode.

In operation S43, an operation of powering down a TIA may be performed. For example, the TIA 252' of FIG. 4 may be powered down in response to an inactivated TIA control signal (for example, C_TIA of FIG. 6D) received from the switch controller 292. Accordingly, the TIA 252' may stop an amplifying operation and may not contribute to the converting operation of the TX input signals TXin+, TXin−. In addition, power consumption caused by the TIA 252' may decrease compared to the wide bandwidth mode. As a result, the second converting circuit CKTb of FIG. 3B may be formed in the current-to-voltage converter 250'.

Figure 11:
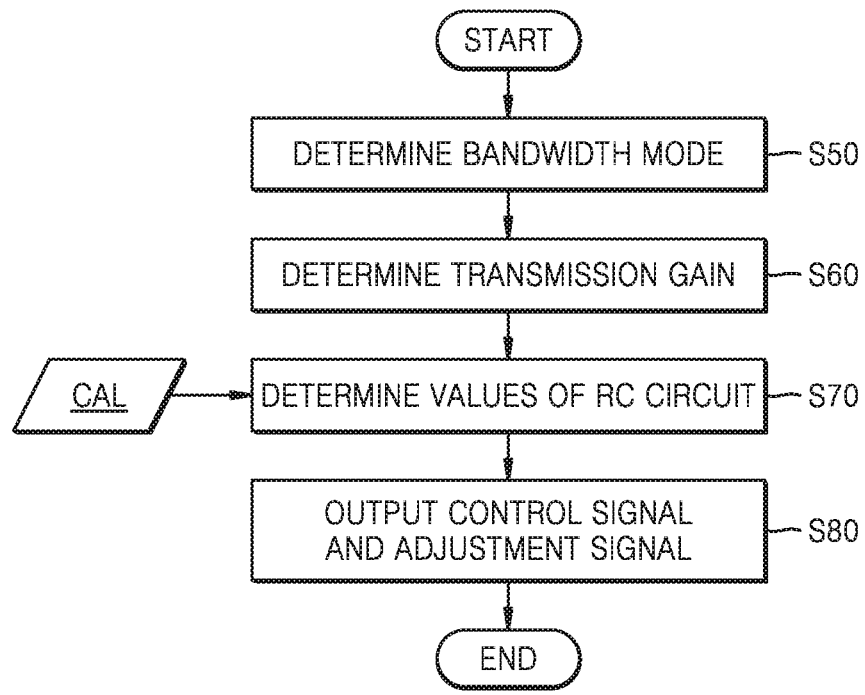
FIG. 11 is a flowchart illustrating a method of controlling a current-to-voltage converter, according to an example embodiment.

FIG. 11 is a flowchart illustrating a method of controlling a current-to-voltage converter, according to an example embodiment. In particular, FIG. 11 illustrates a method of controlling a current-to-voltage converter arranged at an input stage of a transceiver when transmitting a signal through a wireless channel. For example, the method of FIG. 11 may be performed by the controller 730 of FIG. 8 to control the current-to-voltage converter 750 of the transceiver 700 of FIG. 8. FIG. 11 is described below with reference to FIG. 8.

In operation S50, a bandwidth mode may be determined. For example, the controller 730 may share a bandwidth of a signal with another apparatus communicating with the apparatus 20 in a wireless communication system. A plurality of bandwidths may be defined in the wireless communication system, and a bandwidth that both of the apparatus 20 and the other apparatus may support may be determined and be shared.

In operation S60, transmission gain may be determined. For example, the controller 730 may determine transmission gain based on factors such as a state of the wireless channel, transmission power required by the other apparatus, and a power state of the apparatus 20.

In operation S70, values of an RC circuit may be determined. For example, as described above with reference to FIG. 2, etc., the current-to-voltage converter 750 may include an RC circuit including a resistor and a capacitor connected to each other in parallel. The resistor and the capacitor included in the RC circuit may be a variable resistor and a variable capacitor, and thus, a resistance value and a capacitance of the resistor and the capacitor included in the RC circuit may be determined based on the bandwidth mode, the transmission gain, and the calibration data CAL. In some embodiments, as described above with reference to FIG. 9, the capacitor of the RC circuit may be determined to have low capacitance in a wide bandwidth mode and may be determined to have high capacitance in a narrow bandwidth mode.

In operation S80, a control signal and adjustment signal may be output. For example, as shown in FIG. 8, the controller 730 may output the control signal CTR to the switch controller 792 and output the adjustment signal ADJ to the RC controller 794.

Figure 12:
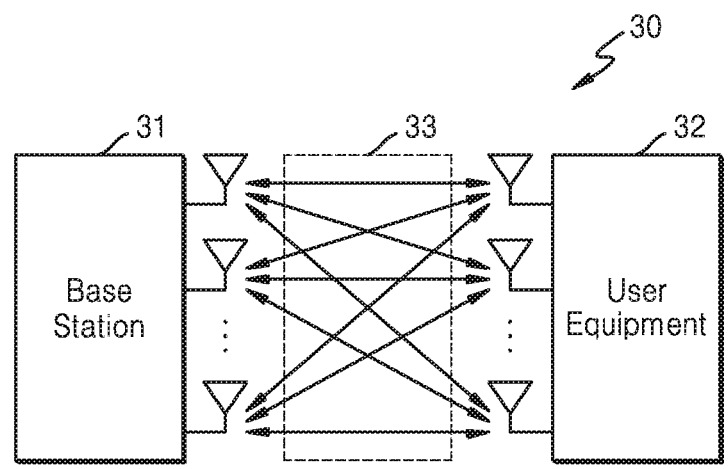
FIG. 12 is a block diagram illustrating examples of an apparatus including a current-to-voltage converter according to an example embodiment.

FIG. 12 is a block diagram illustrating examples of an apparatus including a current-to-voltage converter according to an example embodiment. In particular, FIG. 12 illustrates an example in which a base station 31 and user equipment 32 wirelessly communicate with each other in a wireless communication system 30 using a cellular network. The base station 31 and the user equipment 32 may include a transceiver that supports a plurality of bandwidth modes, and the transceiver may include a current-to-voltage converter and controllers according to the example embodiments described above.

The base station 31 may be a fixed station communicating with user equipment and/or another base station. For example, the base station 31 may be referred to as Node B, evolved-Node B (eNB), a sector, a site, a base transceiver station (BTS), an access point (AP), a relay node, remote radio head (RRH), a radio unit (RU), a small cell, etc. The user equipment 32 may be fixed or mobile and may transmit and receive data and/or control information in communication with a base station. For example, the user equipment 32 may be referred to as terminal equipment, a mobile station (MS), a mobile terminal (MT), a user terminal (UT), a subscriber station (SS), a wireless device, a handheld device, etc.

As illustrated in FIG. 12, the base station 31 and the user equipment 32 may each include a plurality of antennas and may wirelessly communicate with each other through a multiple-input and multiple-output (MIMO) channel 33. The current-to-voltage converter according to an example embodiment may be included in transceivers respectively corresponding to the plurality of antennas and may effectively convert a signal having a wide bandwidth and also convert a signal having a narrow bandwidth with low power.

Figure 13:
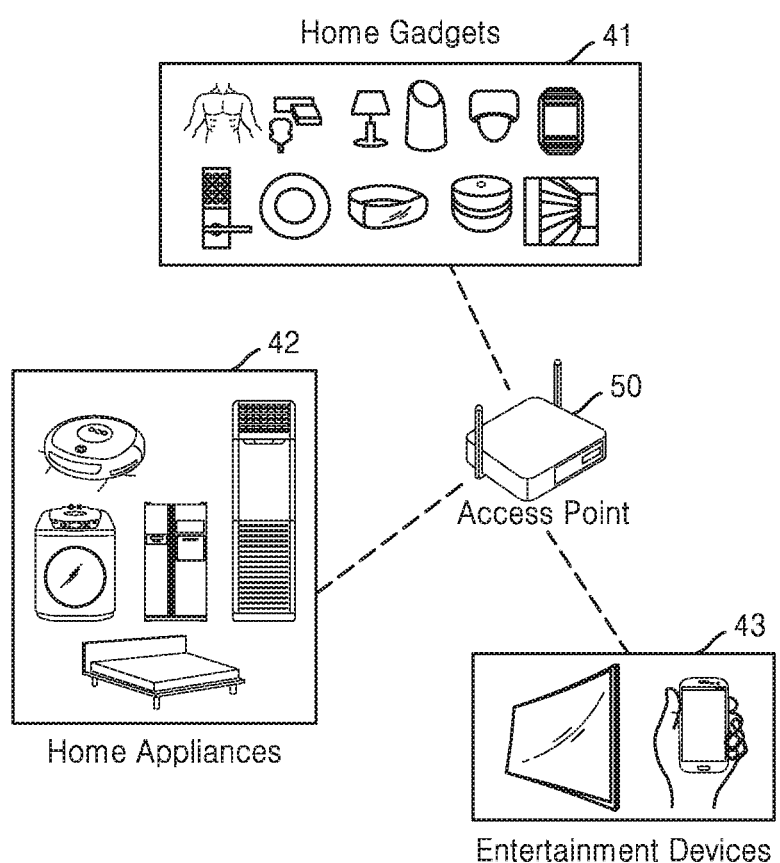
FIG. 13 illustrates examples of an apparatus including a current-to-voltage converter according to an example embodiment.

FIG. 13 illustrates examples of an apparatus including a current-to-voltage converter according to an example embodiment. In particular, FIG. 13 illustrates an example in which various wireless communication devices communicate with each other in a wireless communication system using WLAN. Each of the various wireless communication devices illustrated in FIG. 13 may include a transceiver that supports a plurality of bandwidth modes, and the transceiver may include a current-to-voltage converter and controllers according to the example embodiments described above.

A home gadget 41, a home appliance 42, an entertainment device 43, and an AP 50 may configure an Internet of Things (IoT) network system. The home gadget 41, the home appliance 42, the entertainment device 43, and the AP 50 may each include a transceiver according to an example embodiment as a component. The home gadget 41, the home appliance 42, and the entertainment device 43 may wirelessly communicate with the AP 50, and may also wirelessly communicate with one another.

While the inventive concept has been particularly shown and described with reference to embodiments thereof, it will be understood that various changes in form and details may be made therein without departing from the spirit and scope of the following claims.

What is claimed is:

1. A current-to-voltage converter for converting a current signal into a voltage signal, the current-to-voltage converter comprising:
a trans-impedance amplifier comprising an input terminal and an output terminal;
a resistor-capacitor (RC) circuit comprising:
a first end and a second end respectively connected to the input terminal and the output terminal of the trans-impedance amplifier, and
a resistor and a capacitor connected to each other in parallel between the first end and the second end; and
a plurality of switches configured to form:
a first converting circuit configured to convert the current signal via the trans-impedance amplifier and the RC circuit in a wide bandwidth mode, and
a second converting circuit configured to convert the current signal via the RC circuit in a narrow bandwidth mode.

2. The current-to-voltage converter of claim 1, wherein the first converting circuit is further configured to output the voltage signal at the second end of the RC circuit, and
wherein the second converting circuit is further configured to output the voltage signal at the first end of the RC circuit.

3. The current-to-voltage converter of claim 1, wherein, in the second converting circuit, the second end of the RC circuit is connected to ground.

4. The current-to-voltage converter of claim 1, wherein the trans-impedance amplifier is configured to power down in the narrow bandwidth mode.

5. The current-to-voltage converter of claim 1, further comprising an input pin configured to receive the current signal from an outside of the current-to-voltage converter.

6. The current-to-voltage converter of claim 5, further comprising a current source configured to withdraw direct current from the input pin in the wide bandwidth mode.

7. The current-to-voltage converter of claim 1, wherein the plurality of switches comprise:
a first switch connected between the first end of the RC circuit and an output node for the voltage signal;
a second switch connected between the second end of the RC circuit and ground; and
a third switch connected between the second end of the RC circuit and the output node.

8. The current-to-voltage converter of claim 7, wherein the first switch and the second switch are configured to be turned off in the wide bandwidth mode and be turned on in the narrow bandwidth mode, and
wherein the third switch is configured to be turned on in the wide bandwidth mode and be turned off in the narrow bandwidth mode.

9. The current-to-voltage converter of claim 7, wherein each of the first switch, the second switch, and the third switch comprises a respective transistor configured to electrically connect two ends to each other according to a gate voltage.

10. The current-to-voltage converter of claim 1, wherein the capacitor comprises a variable capacitor, and
wherein, the capacitor has a first capacitance value in the wide bandwidth mode and a second capacitance value in the narrow bandwidth mode, the first capacitance value being less than the second capacitance value.

11. A current-to-voltage converter for converting a current signal into a voltage signal, the current-to-voltage converter comprising:
a trans-impedance amplifier;
a resistor-capacitor (RC) circuit comprising a resistor and a capacitor connected to each other in parallel; and
a plurality of switches configured to perform:
applying the RC circuit as a feedback to the trans-impedance amplifier in a wide bandwidth mode, and
applying the RC circuit as a shunt between the current signal and ground in a narrow bandwidth mode.

12. The current-to-voltage converter of claim 11, wherein the trans-impedance amplifier is configured to output the voltage signal in the wide bandwidth mode, and
wherein the shunt is configured to output the voltage signal in the narrow bandwidth mode.

13. The current-to-voltage converter of claim 11, wherein the trans-impedance amplifier is configured to power down in the narrow bandwidth mode.

14. The current-to-voltage converter of claim 11, further comprising an input pin configured to receive the current signal from an outside of the current-to-voltage converter.

15. The current-to-voltage converter of claim 11, wherein the RC circuit has two ends respectively connected to an input terminal and an output terminal of the trans-impedance amplifier.

16. The current-to-voltage converter of claim 15, wherein the plurality of switches comprise:
a first switch configured to connect the input terminal of the trans-impedance amplifier to an output node for the voltage signal in the narrow bandwidth mode;
a second switch configured to connect the output terminal of the trans-impedance amplifier to the ground in the narrow bandwidth mode; and
a third switch configured to connect the output terminal of the trans-impedance amplifier to the output node in the wide bandwidth mode.

17. An apparatus comprising:
a signal processor configured to output a control signal and a current signal in a baseband; and
a transmitter comprising a current-to-voltage converter configured to operate in at least one of a wide bandwidth mode and a narrow bandwidth mode according to the control signal, and convert the current signal into a voltage signal, the transmitter being configured to output a radio frequency (RF) signal based on the voltage signal,
wherein the current-to-voltage converter comprises:
a trans-impedance amplifier configured to power down in the narrow bandwidth mode; and
a resistor-capacitor (RC) circuit comprising a resistor and a capacitor connected to each other in parallel and configured to allow at least a portion of the current signal to pass through in each of the wide bandwidth mode and the narrow bandwidth mode.

18. The apparatus of claim 17, wherein the signal processor is further configured to output an adjustment signal according to at least one of the wide bandwidth mode and the narrow bandwidth mode, and
wherein the transmitter further comprises an RC controller configured to change at least one of a resistance value of the resistor and a capacitance value of the capacitor according to the adjustment signal.

19. The apparatus of claim 18, wherein the signal processor comprises calibration data comprising information regarding a plurality of resistance values of the resistor and a plurality of capacitance values of the capacitor and is further configured to output the adjustment signal based on the calibration data.

20. The apparatus of claim 17, further comprising:
a substrate on which the signal processor and the transmitter are mounted,
wherein the current signal is transmitted from the signal processor to the transmitter through a pattern of the substrate.

* * * * *